United States Patent [19]

Epstein et al.

[11] 4,000,505
[45] Dec. 28, 1976

[54] THIN OXIDE MOS SOLAR CELLS

[75] Inventors: Arnold S. Epstein, Washington, D.C.; Stewart Share, Brookeville, Md.

[73] Assignee: The United States of America as represented by the Secretary of the Army, Washington, D.C.

[22] Filed: Aug. 8, 1975

[21] Appl. No.: 603,212

[52] U.S. Cl. .................. 357/30; 357/6; 357/52; 357/23
[51] Int. Cl.² .................. H01L 27/14
[58] Field of Search .................. 357/30, 6, 52, 23

[56] References Cited
UNITED STATES PATENTS

| | | | |
|---|---|---|---|
| 3,493,767 | 3/1970 | Cohen | 250/211 |
| 3,911,465 | 10/1975 | Foss | 357/23 |

*Primary Examiner*—Martin H. Edlow
*Attorney, Agent, or Firm*—Nathan Edelberg; Robert P. Gibson; Saul Elbaum

[57] ABSTRACT

A semiconductor device comprising a first layer of semiconductor material having a bulk region of p-type conductivity and an inversion surface of n-type conductivity which forms a p-n junction with said bulk region, a covering layer on said inversion surface of oxides of silicon in a thickness of about 20–50 angstroms, and metallic contacts placed over said oxide layer.

8 Claims, 2 Drawing Figures

THIN OXIDE MOS SOLAR CELLS

The invention described herein may be manufactured, used, and licensed by or for the United States Government for governmental purposes without the payment to us of any royalty thereon.

BACKGROUND OF THE INVENTION

This invention is in the field of semiconductor solar cells, and more particularly is a semiconductor solar cell with an inversion layer having a relatively high concentration of charge carriers and a method of preparation thereof.

Semiconductor solar cells are well-known in the art. They are known to have p-n junctions near the surface of the device which are exposed to solar light radiation. The photoelectric energy is created by light waves which generates hole-electron pairs. Solar cells, such as Si or CdS cells are sensitive to wave lengths from about 1 $\mu$ down to 0.45 $\mu$.

It is well-known that a silicon dioxide layer formed on the surface of p-type silicon or other p-type semiconductors will produce an n-type inversion layer in the semiconductor. Thus, a p-n junction will exist at a shallow depth. However, it is widely accepted that the ordinary oxidation of p-type silicon surface results in an inversion layer having a charge concentration of only $10^{11}$ charge carriers/cm$^2$ as contrasted with a diffused type junction with a diffused layer having a charge concentration of $10^{15}$ carriers/cm$^2$. It may be noted that an inversion layer is induced and when the inducing material, e.g., silicon dioxide, is removed the inversion layer disappears and a substrate reverts back to the p-type semiconductor.

The reason why the silicon dioxide produces an inversion layer in the semiconductor material is attributed partially to interface states and also to the fact that silicon dioxide has a tendency to become positively charged when in contact with another material.

Oxidized silicon surfaces have been studied in connection with transistors, micro circuits and MOS transistors. All these studies indicate that the oxide induces in silicon a negative charge having a charge concentration of approximately $10^{11}$ charge carriers/cm. The oxide may also be contaminated with foreign ions such as hydrogen or sodium, etc. These ions are usually positive so that they can add to the produced charge and raise it to $10^{12}$ charges/cm$^2$. Generally, the presence of foreign ions is undesirable because their density cannot be controlled and they are mobile in the oxide.

U.S. Pat. No. 3,769,558 of Lindmayer discloses a semiconductor device of a p-type substrate having oxide covering layers of silicon and chromium of thicknesses between 800 and 1,000 angstroms thick. The oxide covering gives rise to inversion layer of the n-type conductivity on the bulk substrate. The collection of the charge to the external circuit would be accomplished by a Schottky type metal-semiconductor contact wherein the metal is in direct contact with the semiconductor.

One of the concepts proposed for obtaining electrical energy is the electrical power from space concept. This concept involves satellites in space equipped with solar cells which would convert the solar energy to DC power. The DC power generated in space by the satellites would be beamed by means of microwaves to the ground and reconverted to high voltage DC or AC power. The essential characteristics of the solar cells for use in this application are that the solar cells be capable of covering as much of the solar spectrum as possible to obtain the highest practical conversion efficiency and that the fabrication of the solar cells be free of critical processing steps so as to reduce the cost of producing them and to make them feasible for large-scale use.

SUMMARY OF THE INVENTION

The present invention relates to an improved solar cell having a thin oxide layer wherein the current flow is by means of tunneling across or through the thin oxide layer. More particularly, the present invention relates to solar cells containing the combination of features of:

1. Having a thin oxide layer of silicon of between 20 to 50 angstroms so as to permit the direct tunneling of one of the carriers between a silicon substrate and a metal substrate. The utilization of such a thin layer of oxide would also tend to minimize the absorption of the incident light of short wave lengths in the oxide layer and permit greater absorption in the silicon itself.

2. The utilization of p-type conductive silicon so that an inversion layer can be created at the surface and the electron which has a higher mobility than the hole in the silicon can be used as the minority carrier. The electron may also be the tunneling element in the charged transport or conduction process used to make the device function.

3. Supplying a lateral conductivity at the interface through the generation of an inversion layer. The inversion layer being located close to the incident absorption of light, preferably for short wave lengths, and serving as a conduction path for electrons that may be tunneled between the silicon and a metal contact. Additionally, the inversion layer is such that it may permit a decrease in the amount of metal present on the oxide surface which in turn would reduce the amount of incident light absorbed on the outside surface.

The metal contact utilized is preferably aluminum or other metals with a high metal-semiconductor work function difference.

DESCRIPTION OF THE PREFERRED EMBODIMENTS

Figure 1:
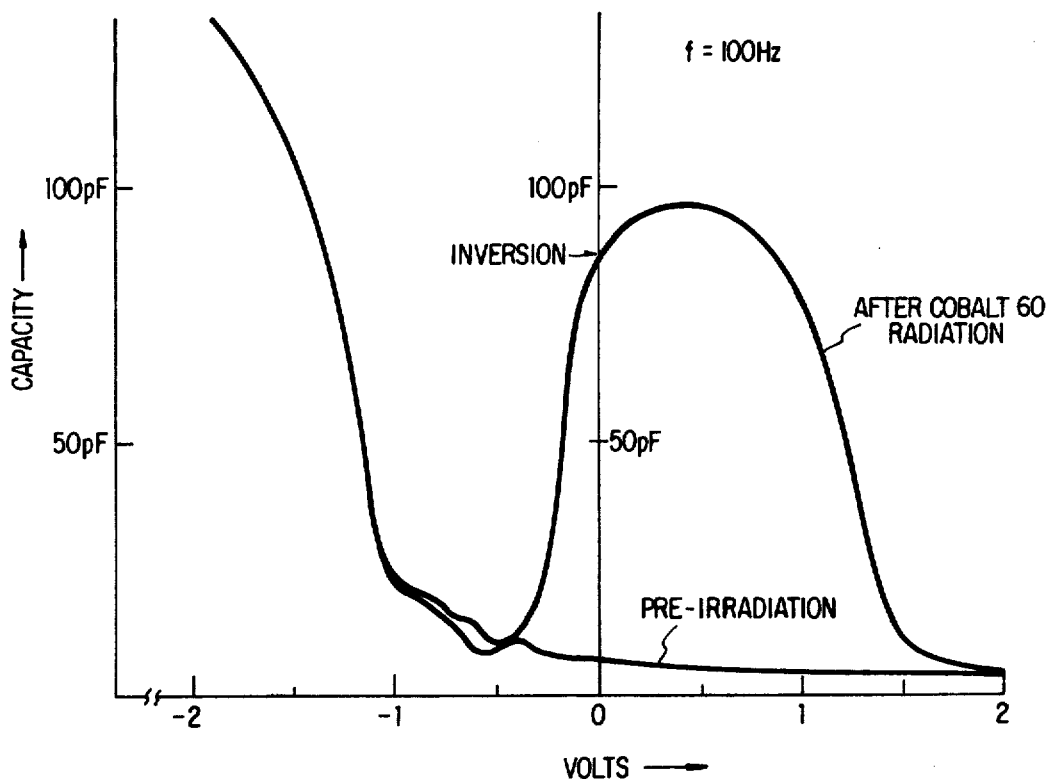
FIG. 1 illustrates the appearance of an inversion layer of the solar cell device according to the present invention.

As seen in FIG. 1, a method for providing a solar device containing an inversion layer together with the inherent unique characteristics is to utilize a cobalt 60 source for generating the inversion layer and a 30 angstrom oxide layer with a p-type conductivity silicon substrate together with an aluminum metal contact. The presence of an inversion layer can be seen from the frequency dependent, capacity-voltage measurements as shown in FIG. 1. In accordance with the present invention, the characteristics noted in the inversion layer are at the lower frequency, such as the 100 HZ shown in the drawing. This effect only appears on p-type substrates and not n-type substrates. The amount of radiation constitutes approximately 10 minutes of exposure to the radiation source. Further, it may be noted that the increase in capacity symbolic of the inversion, occurs without any applied bias, a condition which is especially of interest for solar cells wherein no external bias is applied.

Other methods of generating the inversion layer with a zero applied bias using the non-stoichiometric growth of silicon is described in Reference 1.* Another technique of generating the inversion is to utilize a hydroxy radical as introduced through water vapor in the growth of the oxide. However, in both of these cases an applied bias may be necessary for optimum utilization of the inversion layer.

*Reference 1: "Effects of Ionizing Radiation on Thin-Oxide (20-1500A) MOS Capacitors." S. Share, A. S. Epstein, V. Kumar, W. E. Dahlke and W. Haller, J. Appl. Phys., 45, 4894 (1974).

The type of metal which may be used to contact the oxide layer should be one which would give rise to a sizable work function difference with p-type silicon. For example, aluminum metal and a p-type silicon of about $10^{16}$ carriers/cm$^2$ having a work function difference of about 1 volt may be expected.

Figure 2:
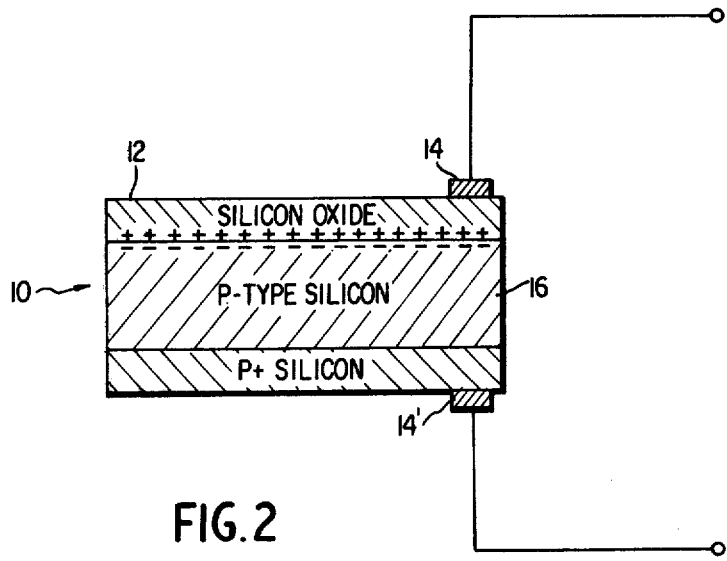
FIG. 2 schematically illustrates the solar cell in accordance with the present invention.

FIG. 2 schematically illustrates a thin oxide MOS solar cell 10 with a silicon substrate 16 having a silicon oxide layer 12 of about 20 to 50 angstroms. Metal contacts 14, 14' are placed over the oxide layer. The cell 10 utilizes the radiation in the processing of the inversion layer only when all of the combined features of the present invention are present. The cell permits an increase of response to the shorter wave lengths of the solar spectrum and results in higher quantum yield. The device utilizes tunneling as part of the conduction process rather than mainly relying on diffusion as in n-p junction. In operation of the device, the electrons are able to travel along the inversion layer until they tunnel through the oxide to the metal located in a region on the oxide surface as shown in FIG. 2. By this means, there is an extension of the effective area available to the incident solar spectrum.

By fabricating the solar cell according to the structure of FIG. 2, there is eliminated the necessity of controlling the impurity profile of a junction.

The thin oxide MOS solar cell of the present invention preferably utilizes an oxide of silicon such as SiO and SiO$_2$. The oxides of silicon may be either in the mono or polycrystalline form, epitaxial, ribbon type, or bulk form.

One method of forming the solar cell of the present invention is to immerse a silicon body in hydrofluoric acid, nitric acid and water, so as to produce a silicon monoxide coating on the p-type regions of the silicon body so as to form the specific thickness of the oxide layer contemplated by the present invention. In utilizing this method, it is necessary that the concentration of nitric acid in the solution be maintained within a narrow critical range and that the silicon solar cell remain in the solution for a controlled time so as to ensure that a coating having a thickness of 20-50 angstroms will result. One means of preparing the solar cell is disclosed in U.S. Pat. No. 3,091,555 of Smythe; however, a control of the oxide thickness is required.

The metal contact in the solar cell is placed over the oxide layer in a small region for contact. This feature is also a critical requirement in the present invention. The current flow occurs by electrons conducted in the inversion layer and tunneling to the metal contact while holes flow into the bulk p-type silicon to the bottom metal contact.

Additionally, the silicon dioxide layer may be formed on the silicon surface by vapor deposition by conventional means such as disclosed in U.S. Pat. No. 3,706,918 of Barone et al.

It is understood that the invention is not limited to the exact details of construction as shown and described, for obvious modifications may be made by persons skilled in the art.

What is claimed is:

1. A semiconductor device comprising a first layer of semiconductor material having a bulk region of p-type conductivity and an inversion surface of n-type conductivity which forms a p-n junction with said bulk region, a covering layer on said inversion surface of oxides of silicon in a thickness of about 20-50 angstroms, and metallic contacts placed over said oxide layer which give rise to a sizable work function difference with the p-type conductive region.

2. A semiconductor device as claimed in claim 1 wherein said metallic contacts are aluminum.

3. A method for forming a device for converting solar energy into electrical energy comprising forming an oxide layer of silicon in thickness of 20-50 angstroms on an element of silicon of a p-type, providing metallic contacts over said oxide layer which give rise to a sizable work function difference with the p-type conductive region and supplying a lateral conductivity at the interface through the generation of an inversion layer.

4. The method of claim 3 wherein the inversion layer is located close to an incident absorption of light and serves as a conduction path for electrons tunneling between the silicon and said metal contact.

5. The method of claim 3 wherein said metal contact is aluminum.

6. A semiconductor device as claimed in claim 3 wherein said inversion layer is generated by irradiation.

7. A semiconductor device as claimed in claim 3 wherein said inversion layer is generated by the non-stoichiometric growth of silicon.

8. A semiconductor device as claimed in claim 3 wherein said inversion layer is generated by a water vapor technique.

* * * * *